United States Patent
Moroz

(10) Patent No.: US 6,868,800 B2
(45) Date of Patent: Mar. 22, 2005

(54) BRANCHING RF ANTENNAS AND PLASMA PROCESSING APPARATUS

(75) Inventor: Paul Moroz, Marblehead, MA (US)

(73) Assignee: Tokyo Electron Limited, Tokyo (JP)

(*) Notice: Subject to any disclaimer, the term of this patent is extended or adjusted under 35 U.S.C. 154(b) by 241 days.

(21) Appl. No.: 10/251,883

(22) Filed: Sep. 23, 2002

(65) Prior Publication Data

US 2003/0062840 A1 Apr. 3, 2003

Related U.S. Application Data

(60) Provisional application No. 60/325,199, filed on Sep. 28, 2001, and provisional application No. 60/325,188, filed on Sep. 28, 2001.

(51) Int. Cl.⁷ ............................................. C23C 16/509
(52) U.S. Cl. .............................. 118/723 E; 315/111.51; 118/725; 156/614
(58) Field of Search .................. 315/111.01–111.91; 156/614, 345; 118/725, 723 E, 728, 723 I, 723 AN

(56) References Cited

U.S. PATENT DOCUMENTS 3,916,034 A * 10/1975 Tsuchimoto ................. 156/614
6,101,970 A * 8/2000 Koshimizu .............. 118/723 E
6,179,924 B1 * 1/2001 Zhao et al. .................. 118/725

* cited by examiner

Primary Examiner—Wilson Lee
(74) Attorney, Agent, or Firm—Oblon, Spivak, McClelland, Maier & Neustadt, P.C.

(57) ABSTRACT

The inductively coupled plasma source and antenna geometry are significant factors in determining plasma and process uniformity inside the chamber. Growing demands for processing larger and larger wafers or LCD substrates and providing higher and higher degrees of plasma uniformity challenge the current ICP type antenna designs and push development of sources. Branching RF antenna, featuring a plurality of major and minor branches, provides improved coverage of processing area, reduced standing wave effect, improved uniformity of inductively coupled electromagnetic field, more uniform plasma production, and more homogeneous processing conditions throughout the whole processing area.

31 Claims, 6 Drawing Sheets

500

600

800

BRANCHING RF ANTENNAS AND PLASMA PROCESSING APPARATUS

CROSS REFERENCE TO RELATED APPLICATIONS

The present application is related to and claims priority to U.S. provisional Ser. No. 60/325,199 filed on Sep. 28, 2001, which is herein incorporated by reference in its entirety. The present application is also related to International application serial no. PCT/US02/28140, filed on Sep. 25, 2002, which claims priority to U.S. provisional application Ser. No. 60/325,188 filed on Sep. 28, 2001. Those applications are herein incorporated by reference in their entirety.

FIELD OF THE INVENTION

The present invention relates generally to a plasma material processing apparatus and more particularly to apparatus for and method of plasma generation of the induction coupling type in which induction plasma is excited by applying electromagnetic energy to a branching RF antenna.

BACKGROUND OF THE INVENTION

Many types of plasma material processing methods are widely accepted for semiconductor fabrication and plasma generation including: sputter etching, plasma-enhanced chemical etching, reactive ion etching, plasma-enhanced vapor deposition, ionized sputter deposition and magnetically enhanced plasma etching. Different types of well-known plasma sources are used in these processes such as the popular inductively coupled plasma (ICP) sources as well as others including: capacitively coupled plasma (CCP) sources, microwave plasma sources (including those that utilize the electron-cyclotron resonance for improved efficiency of power deposition into the plasma), surface wave plasma sources, and helicon plasma sources. In many sources, radio frequency (RF) power can be applied to a RF antenna such that process gas supplied to the plasma generating space is excited, disassociated and ionized. This excitation occurs due to a radio frequency electromagnetic field formed by RF currents in the antenna generating the plasma.

The inductively coupled plasma source and antenna geometry are significant factors in determining plasma and processing uniformity inside the chamber. The growing demands for processing larger and larger wafers or LCD (liquid crystal display) substrates and providing higher and higher degrees of plasma uniformity challenge the current ICP type antenna designs and push development of sources.

Traditional spiral RF antennas are becoming too long for larger wafers or LCD substrates and cannot generate uniform plasmas. Furthermore, such RF antennas are unable to provide the required plasma homogeneity in both, flat and dome-shaped, geometries. Problems with RF antennas occur due to the lengthening of antenna elements relative to the electromagnetic wave and because of the standing wave effects. The standing wave effects become stronger during increased frequency operation of increased wafer or substrate size, limiting the RF antenna's area of application and reducing uniformity.

In addition, radially extended RF antennas are becoming non-efficient because they are not able to uniformly cover the entire plasma processing area over the substrate. Area coverage reduces outwardly from the endpoint such that there is satisfactory coverage closer to the center of the antenna, but unsatisfactory coverage between any two radially extending "arms" of the antenna.

The dome-type antennas are similarly unable to perform adequately given the increasing size of the plasma area and substrates.

Finally, the antennas wired around the sides of the vacuum chamber are becoming inefficient because they cannot provide adequate RF fields in the inner half of the plasma volume.

What is required is a redesigned RF antenna apparatus and method for generating more uniform plasma coverage over larger areas.

BRIEF SUMMARY OF THE INVENTION

The present invention has been made in consideration of the above-described problems whose appearance in conventional plasma material processing of the RF induction coupling type where induction plasma excitation is created by applying power to a RF antenna. Accordingly, it is an object of the present invention to provide a novel branching RF antenna for use in plasma material processing operations.

It is another object of the present invention to improve the uniformity of plasma generation.

It is still another object of the present invention to reduce standing wave effects for improved plasma material processing.

According to the present invention, there is provided a plasma reactor for generating uniform plasma using an inductively coupled plasma (ICP) source, comprising: a branching radio frequency (RF) antenna coupled to a RF power source for creating an electromagnetic field wherein the electromagnetic field excites process gas in a processing chamber and converts the process gas into plasma; and a window through which the electromagnetic field can penetrate into the plasma reactor.

In addition, there is also provided a method for generating uniform plasma using an inductively coupled plasma (ICP) source, the method comprising the steps of: placing a sample on a work surface; continuously exhausting plasma reactor to pressure-reduced conditions; inputting gas into the plasma reactor; and applying RF power to a branching RF antenna, the branching RF antenna providing a uniform field to the gas in a processing chamber wherein uniform plasma is generated.

In a first aspect of the present invention, the branching RF antenna comprises a plurality of major and minor branches with embedded cooling channels extending from a central feed element. This preferred embodiment provides more homogenous plasma generation and thus more uniform coverage of the plasma area.

The plasma processing system for subjecting a target object to a plasma process comprises a process chamber formed in a process vessel; a gas supply system for supplying a process gas to the process vessel; an exhaust system for exhausting and controlling pressure in the process chamber; a susceptor arranged in the process chamber, the susceptor having a work surface for supporting the target object in the process chamber; and an ICP RF source having a branching antenna for sustaining a large uniform plasma during the plasma process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention where.

DETAILED DESCRIPTION OF THE INVENTION

Figure 1A:
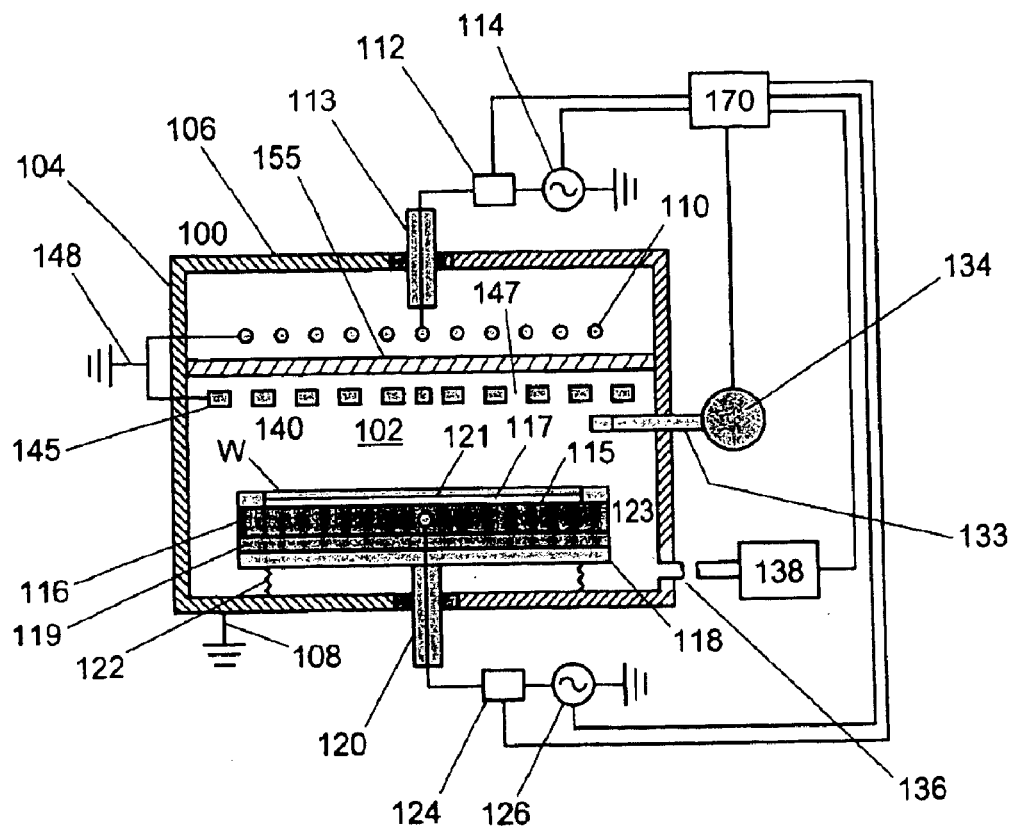
FIG. 1a is a schematic diagram showing a plasma etching system according to a preferred embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

FIG. 1a is a schematic diagram showing a plasma etching system 100 according to a preferred embodiment of the present invention. Plasma etching system 100 comprises an ICP source having a branching antenna.

An airtight process chamber 102 of plasma etching system 100 is constituted by a substantially cylindrical process vessel 104 and top plate 106. Process vessel 104 and top plate 106 are made of a conductive material, such as stainless steel and are grounded through ground line 108.

Faraday shield 140 is electrically coupled to the sidewalls of process vessel 104.

In the illustrated embodiment, Faraday shield 140 comprises a number of conductive elements 145 and spaces 147 arranged in a first pattern. Conductive elements 145 are connected to process vessel 104 via grounding means 148. In this manner, conductive elements 145 are electrically grounded. Alternately, a dual Faraday shield 140 can be used that consists of at least two layers of conductive elements.

In other embodiments of the present invention, the branching RF antenna can be used without a Faraday shield, and it can be located above the dielectric window, or below the dielectric window, or there can be no dielectric window at all, so the branching RF antenna is located within the processing chamber. Desirably, conductive elements 145 are the same size. Alternately, conductive elements 145 can have different sizes. Also, Faraday shield 140 can be DC biased, or a RF power can be applied to it.

Dielectric window 155 is coupled to process vessel 104 and provides a ceiling for process chamber 102. Desirably, dielectric window 155 comprises a dielectric material and provides a dielectric window for antenna 110.

In a preferred embodiment, gas supply line 133 is coupled to the processing chamber 102 to supply processing gas. Gas supply line 133 is coupled to gas source unit 134 through at least one opening/closing valve (not shown) and at least one flow control valve (not shown). The gas source unit 134 has gas sources for a plurality of different gases to be supplied to process chamber 102, e.g., CF4, C4 F8, CO, O2, Ar, and N2.

In an alternate embodiment, gas supply line 133 is coupled to Faraday shield 140, which is used to supply processing gas to chamber 102.

Branching RF antenna 110 is arranged above Faraday shield 140. In a preferred embodiment, branching RF antenna comprises a plurality of major and minor branches. Preferably, the branching RF antenna branches are equally loaded, an advantage for the RF power source and for design simplicity. Maintaining equal loads, especially in the case of n major branches when each major branch covers an n-th part of the plasma area is desirable. However, the principle of equal loads is not required for the invention. In alternate cases, different loads can be used, and other antenna configurations can be used.

Branching RF antenna 110 is connected through a matching unit 112 and transmission line 113 to RF power supply 114. Desirably, RF power supply 114 outputs a plasma generating RF power to branching RF antenna 110 and operates in a RF frequency range of 10–1000 MHz. Alternately, a different number of matching units and/or transmission lines can be used.

In alternate embodiments, branching RF antenna 110 can be connected to at least one other RF power supply (not shown), so different branches can be fed by different RF power supplies, possibly with different frequencies.

Susceptor 116 comprises a conductive material and is arranged in the lower portion of the process chamber 102. Susceptor can be grounded or electrically isolated in the case when RF power is not applied to the susceptor 116 (as in FIG. 1b). However, in preferred embodiment (FIG. 1a), the susceptor is under RF potential supplied by a second RF power supply 126 through the corresponding matching network 124. The RF frequency of the second RF power supply 126 is in the range of 500 kHz-10 MHz. This provides additional biasing potential on the wafer W and improves directionality of charged particle fluxes going from the plasma (not shown) to the wafer W.

The upper surface of the susceptor 116 serves as a wafer-holding surface and an insulating layer 115 made of, e.g., polyimide is adhered to the upper surface. On the insulating layer 115, a conductive electrostatic chuck electrode 117 and a resistive layer 121 are arranged. The chuck electrode can be prepared by forming a silver or palladium film on the lower surface of the resistive layer. A conductive line (not shown) covered by an insulating cable is provided in the susceptor and connected to the chuck electrode 117. On the other end, this conductive line is connected to a DC power supply through a switch (not shown).

A gas supplying passage (not shown) is provided through the resistive layer 121 to the rear surface of the wafer W for supplying a heat conductive gas, such as He. Further, there is a plurality of pusher pins, e.g. three, for moving a wafer up and down with respect to the upper surface of the resistive layer.

The susceptor is mounted on the cooling block 119 made of a thermo-conductive material such as aluminum, which carries tubes with circulating coolant such as liquid nitrogen. The cooling block 119 is coupled to the bottom part of the process chamber through an insulating member 118.

An elevating shaft 120 is movable in the vertical direction by the elevating mechanism (not shown). It is designed to move the entirety of the work table 123 including susceptor 116, electrostatic chuck 117, cooling block 119, as well as the wafer W, in vertical direction, so the distance between the wafer W and the branching RF antenna 110 can be properly adjusted.

Bellows 122 comprises an airtight member. Bellows 122 is coupled to insulating member 118, surrounds elevating shaft 120, and is coupled to the bottom surface of process chamber 102. Hence, even if the susceptor 116 is moved vertically, the airtightness in process chamber 102 is not impaired.

Process chamber 102 is connected to exhaust line 136 of an exhaust system. Exhaust line 136 is connected to exhaust pump 138 through an opening/closing valve and a flow control valve (not shown). Exhaust pump 138 can exhaust process chamber 102 and set process chamber 102 at a vacuum of, e.g., from 10 mTorr to 100 mTorr.

In a preferred embodiment, controller 170 is coupled to first RF power supply 114, matching network 112, gas source 134, exhaust pump 138, second RF power supply 126, and second matching network 124. Controller 170 comprises hardware and software to control the operation of first RF power supply 114, matching network 112, second RF power supply 126, second matching network 124, gas source 134, and exhaust pump 138. For example, controller 170 can control the frequency, phase, amplitude, and bias of the signals provided by the RF power supply. In addition, controller 170 can control process gas and flow rate to the process chamber 102. Also controller 170 can control the temperature of Faraday shield 140, branching RF antenna 110, and the wafer W by controlling the flow of fluids through cooling channels (not shown).

In plasma etching system 100 shown in FIG. 1a, a process is performed as follows. First, wafer W is placed on the worktable 123 arranged in process chamber 102. Subsequently, process chamber 102 is exhausted by the exhaust system connected to process chamber 102, thereby setting the entire interior of process chamber 102 to a predetermined pressure-reduced atmosphere.

Worktable 123 with wafer W is moved vertically to the working position, so the distance between the wafer W and the branching RF antenna is set to predetermined value defined by the process.

While process chamber 102 is continuously exhausted, a process gas is supplied from process gas supply system 134 to process chamber 102. In a preferred embodiment, the process gas is provided from gas supply system to at least one gas supply pipe, and from the at least one gas supply pipe to process chamber 102. In alternate embodiment, the processing gas is supplied to the Faraday shield; it then enters process chamber 102 from Faraday shield 140 through gas supply holes (not shown in FIG. 1).

In this state, plasma generating RF power is provided to branching RF antenna 110 so that the process gas supplied to process chamber 102 is excited, dissociated, and ionized, thereby generating a uniform wide-area plasma.

In order to prevent Faraday shield 140 from being inductively heated, and to effectively use the input energy from branching RF antenna 110 for generating the plasma, no electric current passageway should be formed in any direction, which is the same as that of an RF electric field. For example, a branching RF antenna 110 may be formed using an almost radial configuration of elements and arranged to have a geometric center aligning with that of wafer W. In such a case, the RF electric field generated by branching RF antenna 110 has an electric field direction which is also mostly in the radial direction. For this reason, a corresponding Faraday shield 140 would be provided with a number of slots, which are arranged concentrically, so the conductive elements in the Faraday shield have mostly azimuthal direction. In other words, slots 147 extend in directions that are substantially perpendicular to the direction of the RF electric field generated by branching RF antenna 110. With this arrangement, the electromagnetic field generated by branching RF antenna 110 is transmitted into process chamber 102 without being cut off, so that the RF electric field is generated in process chamber 102, while capacitive component is considerably reduced. As a result, the input energy from branching RF antenna 110 is effectively used for generating the plasma.

In alternate embodiments, top plate 106 is not required. For example, the process chamber can be formed using a dielectric window, isolation layer, branching RF antenna, and/or gas dispensing apparatus.

Figure 1B:
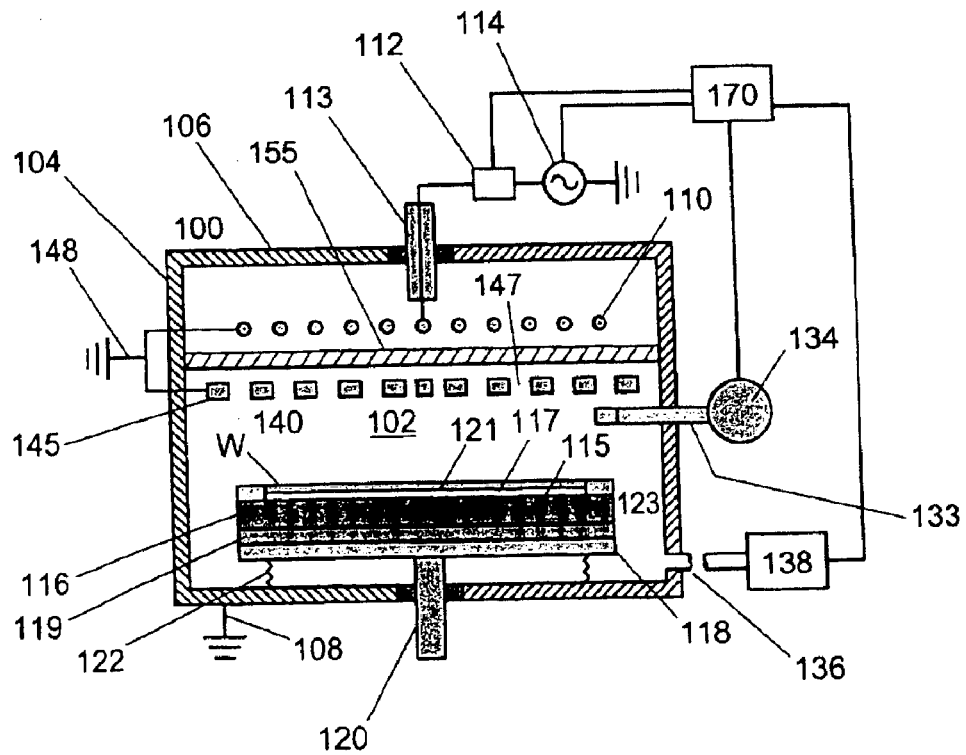
FIG. 1b is a schematic diagram showing a plasma etching system in accordance with an alternate embodiment of the present invention.

FIG. 1b is a schematic diagram showing a plasma etching system according to an alternate embodiment of the present invention. FIG. 1b illustrates a plasma etching system in which a RF power supply system is not coupled to the susceptor.

Figure 1C:
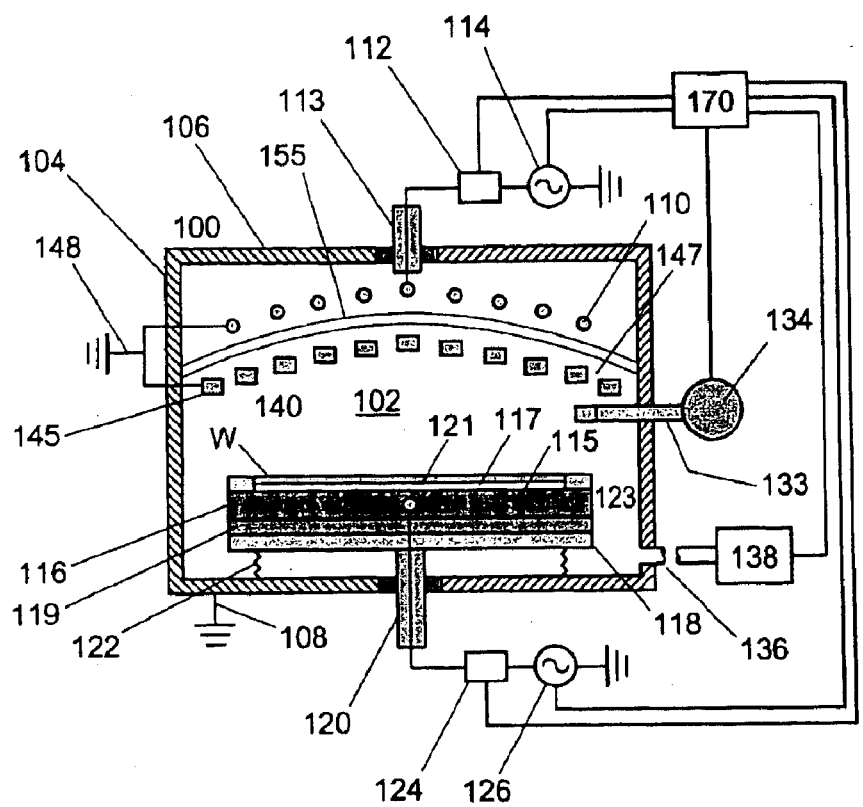
FIG. 1c is a schematic diagram showing a plasma etching system according to another alternate embodiment of the present invention.

FIG. 1c is a schematic diagram showing a plasma etching system according to another alternate embodiment of the present invention. FIG. 1c includes all the features described for the apparatus of FIG. 1a. FIG. 1c., however, illustrates a different geometry for the branching RF antenna, and in the illustrated embodiment, geometry of the dielectric window and the Faraday shield is not flat, but curved. The curvature and configuration of the RF antenna is designed such that a uniform plasma is provided at the surface of wafer W.

Figure 2A:
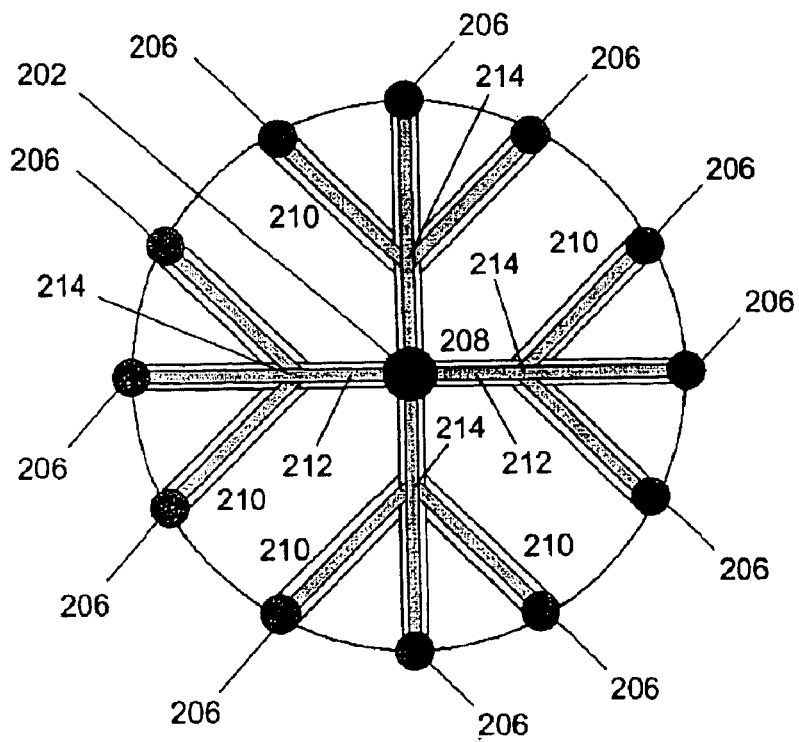
FIG. 2a illustrates a schematic view of a branching RF antenna in accordance with a preferred embodiment of the present invention.
Figure 2B:
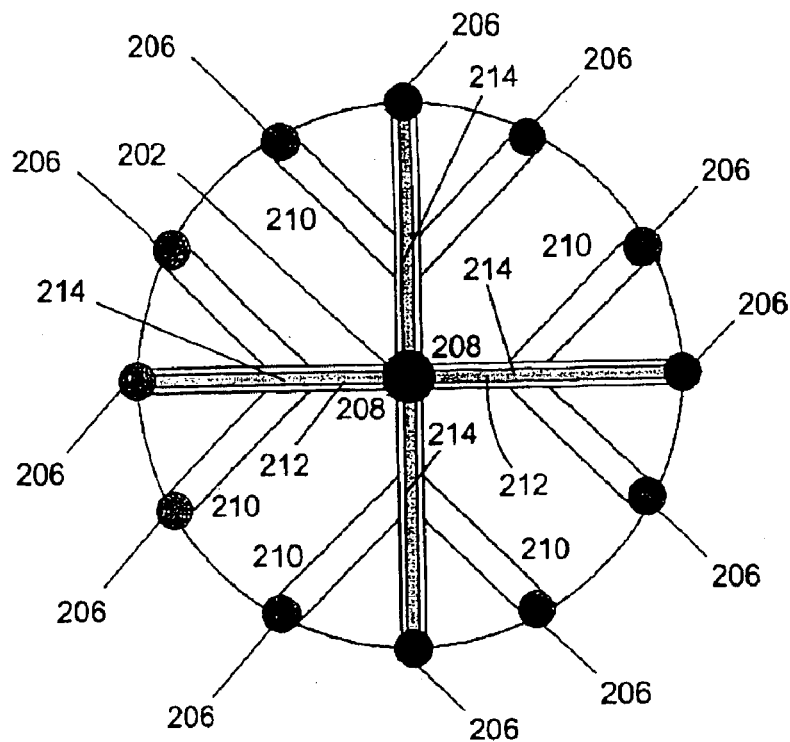
FIG. 2b illustrates a schematic view of a branching RF antenna in accordance with an alternate embodiment of the present invention.

FIG. 2 illustrates a simplified view of a branching RF antenna in accordance with a preferred embodiment of the present invention. FIG. 2a illustrates a branching RF antenna with cooling channels in all branches, in accordance with a preferred embodiment of the present invention. FIG. 2b illustrates a branching RF antenna with cooling channels in some branches, in accordance with an alternate embodiment of the present invention.

Branching RF antenna 200 comprises a plurality of major branches 208 and a plurality of minor branches 210. Each major branch comprises a first number of branches that extend radially from central feed elements 202 in substantially the same direction to branching point 214. Desirably, each branch in a major branch lies in a different plane, but all of the branches in a major branch have the same projection on the plane parallel to the substrate. For example, the branches in a major branch can be electromagnetically coupled and/or electrically coupled to each other but not physically coupled to each other.

At branching point 214, at least one minor branch 210 is coupled to each major branch. Each minor branch extends from branching point 214 in a different direction. Desirably, a substantial portion of each minor branch lies in the same plane. As shown in FIG. 2, three minor branches are coupled to each major branch at the branching point, but this is not required for the invention. In alternate embodiments, at least two minor branches are coupled at one or more branching points to each major branch.

In preferred embodiment, branching RF antenna of FIG. 2a is powered by RF power supply 114 (FIG. 1) through the matching network 12 at the center 202 and is grounded at the outer points 206 on antenna periphery. This provides RF current through major branches 208 and minor branches 210. Desirably, each branch in a major branch is independently coupled to central feed elements 202.

In alternate embodiment, the outer points 206 are connected to the ground through capacitors (not shown).

Major branches 208 have symmetrical geometry and loading for significantly simplifying antenna tuning and ensuring more homogeneous plasma generation. Each major branch 208 covers different azimuthal area.

In alternate embodiments, a different number of major branches 208 and/or a different number of minor branches can be used.

In a preferred embodiment, antenna 200 has cooling channels 212 extending through all its branches. For high RF power, cooling channels 212 can be provided in both major and minor branches 208 and 210. However, an absence of cooling channels 212 in some minor branches 210 (FIG. 2b) can be tolerated when using moderate RF power, relying on minor branches 210 cooling via the high thermo-conductivity of the metal parts of the antenna 200 and proximity of minor branches 210 to other cooled branches.

In an alternative embodiment, branching RF antenna 200 can be placed on a dome-shaped or other non-flat surface. For a dome-shaped, the common center of all the major branches is located at the center of the dome (center of symmetry). For a stepped surface, the common center of all the major branches can be located at the center of the topmost step.

In an alternative embodiment, the branches of any branching RF antenna can be powered at the antenna periphery and grounded at the common center. However, this embodiment can complicate construction due to the increased number of points requiring connection to the power source.

In another embodiment, the major branches can be powered by different RF sources. Also, the major branches can be powered by RF with different phases and/or different frequencies.

Major and minor branches are fabricated using a metal such as anodized aluminum. For example, antenna branches can have a single conductive surface that can be fabricated using a metal such as anodized aluminum. Antenna branches 208, 210 can be fabricated differently for the different antenna configurations.

As shown in FIG. 2, the coupling angle between the minor branches and the major branches is less than ninety degrees, but this is not required for the invention. In alternate embodiments, these coupling angles can be equal to and/or greater than ninety degrees.

As shown in FIG. 2, each major branch comprises one branching point, but this is not required for the invention. In alternate embodiments, at least one major branch can comprise more than one branching point.

Figure 3:
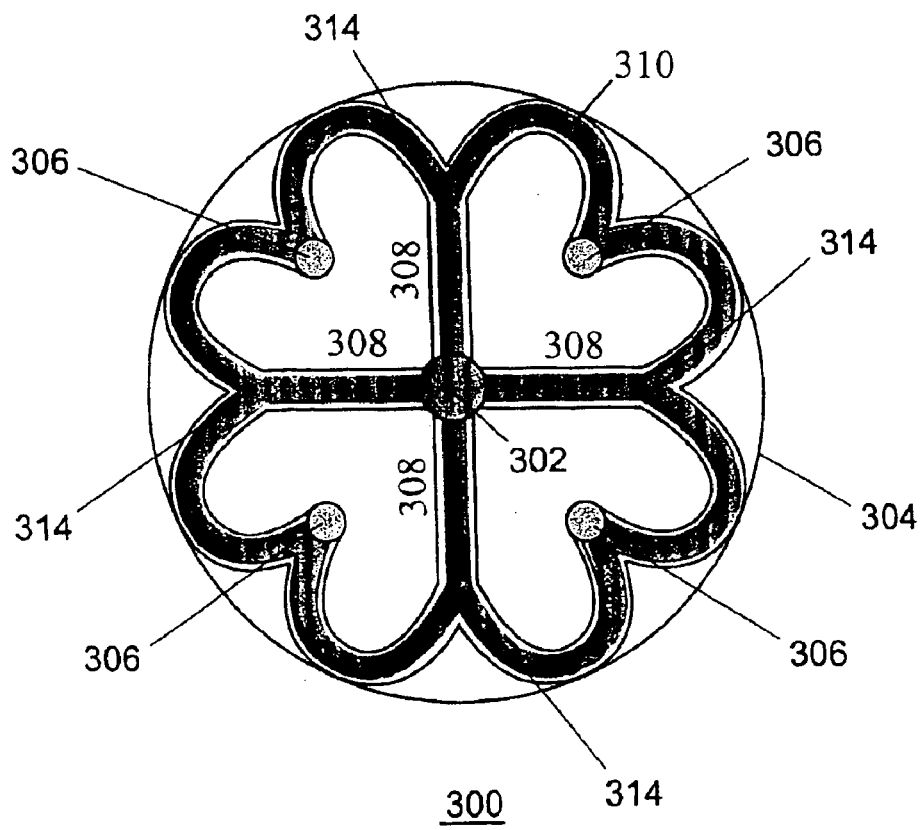
FIG. 3 illustrates a simplified view of a second type of branching RF antenna in accordance with an alternate embodiment of the present invention.

FIG. 3 illustrates a simplified view of a second type of branching RF antenna in accordance with an alternate embodiment of the present invention. FIG. 3 is a simplified view showing a branching RF antenna in accordance with a preferred embodiment of the present invention. FIG. 3 illustrates a branching RF antenna with cooling channels in all branches.

Branching RF antenna 300 comprises a plurality of major 308 branches and a plurality of curved minor branches 310. Each major branch comprises a first number of branches that extend radially from central feed elements 302 in substantially the same direction to branching point 314. Desirably, each branch in a major branch lies in a different plane, but all of the branches in a major branch have the same projection on the plane parallel to the substrate. For example, the branches in a major branch can be electromagnetically coupled and/or electrically coupled to each other but not physically coupled to each other.

At branching point 314, at least two curved minor branches 310 are coupled to each major branch. Each curved minor branch extends from branching point 314 in a different direction. Desirably, a substantial portion of each curved minor branch 310 lies in the same plane, and curved minor branches 310 have the same projection on the plane parallel to the substrate. As shown in FIG. 3, two curved minor branches 310 are coupled to each major branch 308 at branching point 314, but this is not required for the invention. In alternate embodiments, at least two minor branches are coupled at one or more branching points to each branch of the major branch.

Desirably, branching RF antenna 300 is powered by RF power supply 114 (FIG. 1) through the matching network 112 at central feed elements 302 and is grounded at the outer points 306. This provides RF current through major branches 308 and minor branches 310. Each branch in a major branch can be independently coupled to central feed elements 302. In other embodiments, the outer points 306 are connected to the ground through capacitors (not shown).

Major branches 308 have symmetrical geometry and loading for significantly simplifying antenna tuning and ensuring more homogeneous plasma generation. Each major branch 308 covers different azimuthal area.

In alternate embodiments, a different number of major branches 308 and/or a different number of minor branches can be used.

In the illustrated embodiment, antenna 300 has cooling channels 312 extending through all its branches. For high RF power, cooling channels 312 can be provided in both major and minor branches 308 and 310. However, an absence of cooling channels 312 in minor branches 310 (FIG. 4) can be tolerated when using moderate RF power, relying on minor branches 310 cooling via the high thermo-conductivity of the metal parts of the antenna 300 and proximity of minor branches 310 to other cooled branches.

In an alternative embodiment, branching RF antenna 300 can be placed on a dome-shaped or other non-flat surface. For a dome-shaped, the common center of all the major branches is located at the center of the dome (center of symmetry). For a stepped surface, the common center of all the major branches can be located at the center of the topmost step.

In another embodiment, the major branches can be powered by different RF sources. Also, the major branches can be powered by different phases and/or different frequencies.

In another embodiment, branching RF antenna 300 comprises a plurality of coplanar major branches 308 extending radially from central feed element 302 and a plurality of coplanar curved minor branches 310. In this example, branching occurs in the plane of branching RF antenna 300 or on the same surface.

The decreased number of end points 306 simplifies construction of the antenna 300. Preferably, all curved branching elements 310 have symmetrical geometry and loads to significantly simplify antenna tuning and ensure more homogeneous plasma generation. However, alternative embodiments need not require symmetry.

In alternative embodiments, similar to description of branching antenna of FIG. 2, the RF power feed can be arranged going to the end points 306, while the center point 302 is grounded. In yet other alternative embodiments the grounding connecting can be arranged through capacitors (not shown).

Branching RF antenna 300 shown in FIG. 3 can be adjusted to a dome-shape or other non-flat surface.

Figure 4:
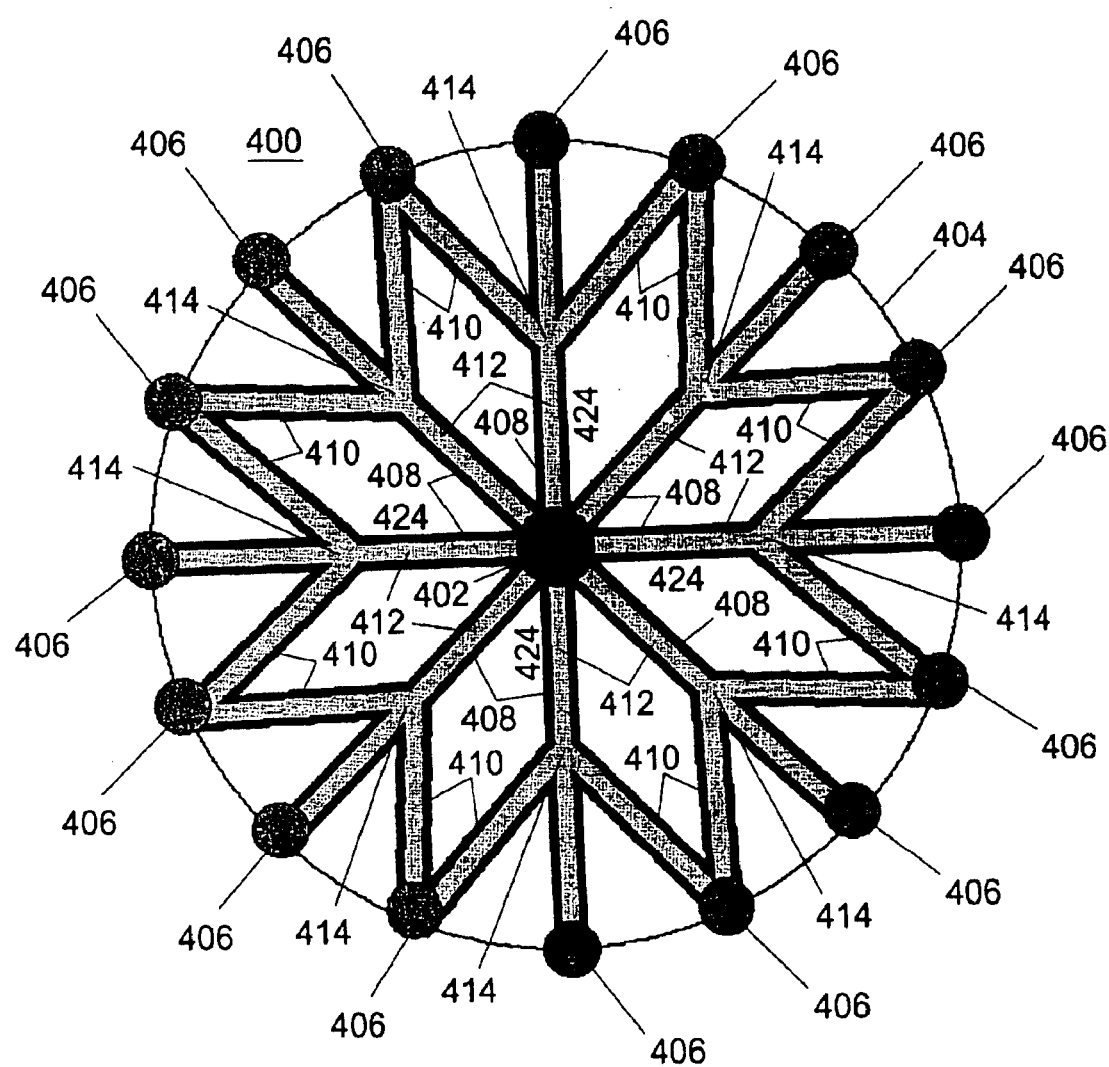
FIG. 4 illustrates a simplified view of a third type of branching RF antenna in accordance with an alternate embodiment of the present invention.

FIG. 4 illustrates a simplified view of a third branching RF antenna in accordance with an alternate embodiment of the present invention.

Branching RF antenna 400 comprises a plurality of major branches 408 and a plurality of minor 410 branches. Major branches 408 are coplanar and extend radially from central feed element 402. Each major branch 408 comprises branching point 414. A number of minor branches 410 are coupled to the branching point 414 of each major branch 408. In addition, central feed element 402 can also be coupled to transmission line 113 (FIG. 1).

In the illustrated embodiment, branching RF antenna 400 has eight major branches 408, which provide a common geometrical center. Each major branch 408 begins from central feed element 402 and extends radially. Branching point 414 is located a first length 424 from central feed element 402. Major branches 408 have symmetrical geometry and loading for significantly simplifying antenna tuning and ensuring more homogeneous plasma generation. Each major branch 408 covers different azimuthal area.

In the illustrated embodiment, three minor branches 410 extend from each branching point 414. Minor branch length 426 is the distance from branching point 414 to grounded outer point 406 on antenna periphery 404. Along antenna periphery 404, each minor branch 410 has distinct endpoint 406. Moderate differences in the geometry and loads of minor branches 410 can be tolerated in this preferred embodiment.

In other alternate embodiments, a different number of major branches 408 and/or a different number of minor branches can be used.

In addition, branching RF antenna 400 can comprise cooling channels 412 that can extend through one or more major branches 408. For high RF power, cooling channels 412 can be provided in both major and minor branches 408 and 410.

In the illustrated embodiment, the flat coplanar branching RF antenna 400 provides a more uniform covering of a larger area thus providing a more homogenous plasma generation as required for larger substrates.

In another alternative embodiment, however, branching RF antenna 400 can be placed on a dome-shaped or other non-flat surface, rather than the preferred flat surface. For a dome-shaped, the common center of all the major branches is located at the center of the dome (center of symmetry). For a stepped surface, the common center of all the major branches can be located at the center of the topmost step.

Figure 5:
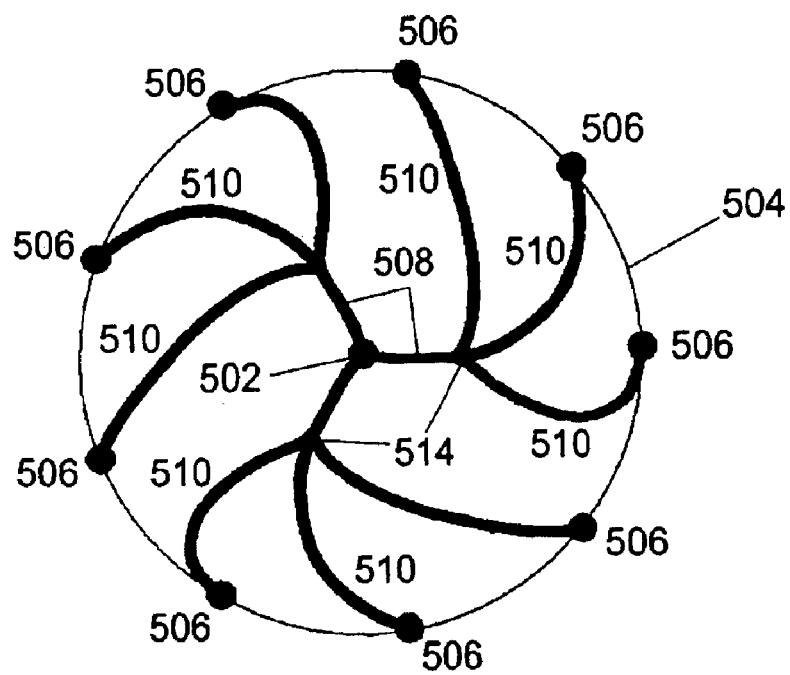
FIG. 5 illustrates a simplified view of a fourth type of branching RF antenna in accordance with an alternate embodiment of the present invention.

FIG. 5 illustrates a simplified view of a fourth type of branching RF antenna in accordance with an alternate embodiment of the present invention.

Branching RF antenna 500 comprises a plurality of major branches 508 and a plurality of minor 510 branches. Major branches 508 are coplanar and extend radially from central feed. Each major branch 508 comprises branching point 514. A number of minor branches 510 are coupled to the branching point 514 of each major branch 508. Central feed element 502 is coupled to transmission line 113 (FIG. 1), and the ends 506 on the periphery are grounded.

In the illustrated embodiment, branching RF antenna 500 has three major branches 508, which provide a common geometrical center. Each major branch 508 begins from central feed element 502 and extends mainly radially. Major branches 508 have symmetrical loading for significantly simplifying antenna tuning and ensuring more homogeneous plasma generation. Each major branch 508 covers different azimuthal area.

In the illustrated embodiment, three minor branches 510 extend from each branching point 514. Along antenna periphery 504, each minor branch 510 has distinct endpoints 506. Moderate differences in the geometry and loads of minor branches 510 can be tolerated in this preferred embodiment.

In other alternate embodiments, a different number of major branches 508 and/or a different number of minor branches can be used.

In addition, branching RF antenna 500 can comprise cooling channels that can extend through major branches 508 and some of minor branches 510. For high RF power, cooling channels can be provided in both major and minor branches 508 and 510.

In the illustrated embodiment, the flat coplanar branching RF antenna 500 provides a more uniform covering of a larger area thus providing a more homogenous plasma generation as required for larger substrates.

In another alternative embodiment, however, branching RF antenna 500 can be placed on a dome-shaped or other non-flat surface, rather than the preferred flat surface. For a dome-shaped, the common center of all the major branches is located at the center of the dome (center of symmetry). For a stepped surface, the common center of all the major branches can be located at the center of the topmost step.

Figure 6:
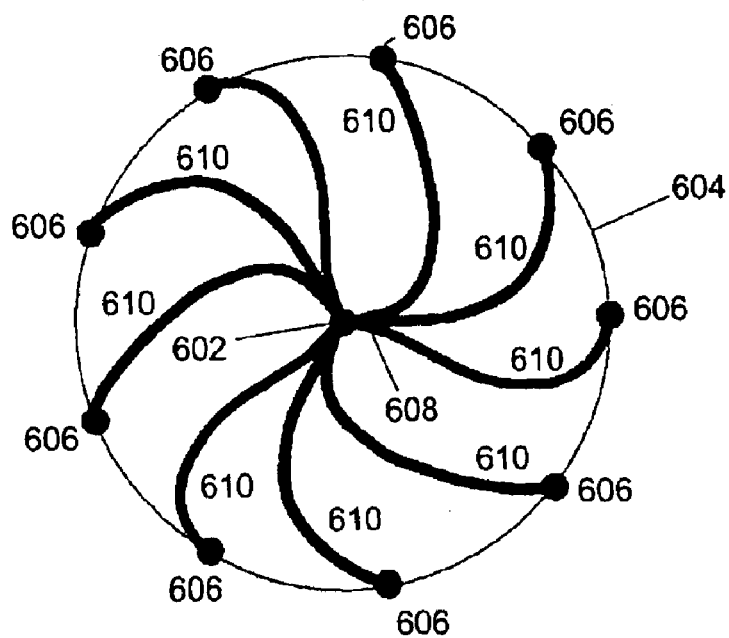
FIG. 6 illustrates a simplified view of an alternate configuration for the fourth type of branching RF antenna in accordance with an alternate embodiment of the present invention.

FIG. 6 illustrates an alternate configuration for the fourth type of branching RF antenna in accordance with an alternate embodiment of the present invention. As illustrated, there are not visible break points shown between the major and minor branches, and the projections on the wafer plane are not combined into single major branches, but there is still significant grouping of branches.

Near the common center 602 the antenna branches are significantly grouped (in the case illustrated in FIG. 6, there are three groups 608 of branches, corresponding to major branches 508 of FIG. 5). In the outer area, the antenna branches 610 go further from each other, similar to the minor branches 510 in FIG. 5.

All branches are fed at the center 602 and grounded at the end points 606 in the periphery 604. Alternately, the antenna branches can be fed at the end points 606 and grounded at the common center 602. Yet alternately, the electrical grounding can be arranged through capacitors (not shown). Cooling channels (not shown) can go through the antenna branches.

In the illustrated embodiment, the flat coplanar branching RF antenna 600 provides a more uniform covering of a larger area thus providing a more homogenous plasma generation as required for larger substrates.

In another alternative embodiment, however, branching RF antenna 600 can be placed on a dome-shaped or other non-flat surface, rather than the preferred flat surface. For a dome-shaped, the common center of all the major branches is located at the center of the dome (center of symmetry). For a stepped surface, the common center of all the major branches can be located at the center of the topmost step.

Figure 7:
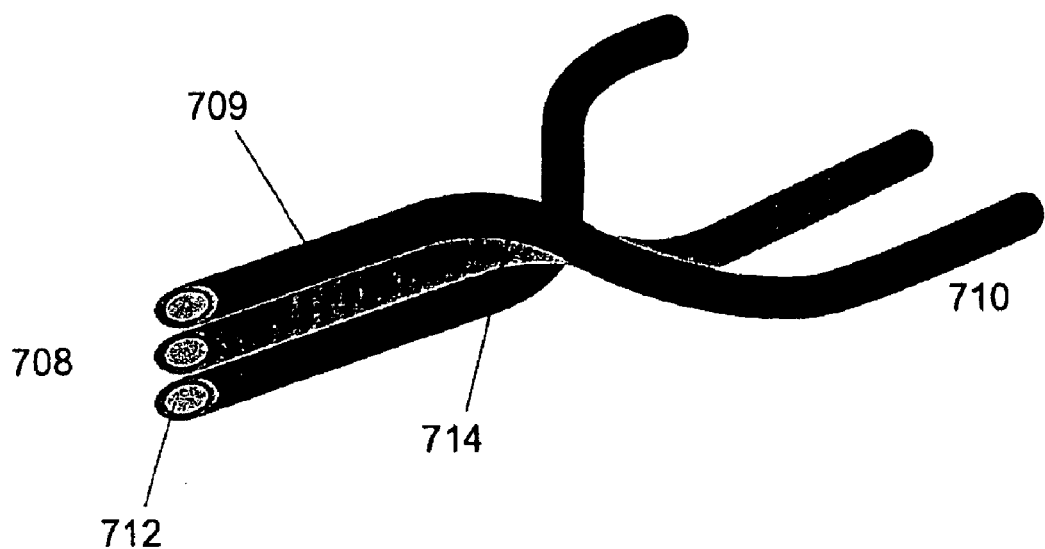
FIG. 7 illustrates a simplified view of a first type of branching in accordance with a preferred embodiment of the present invention.

FIG. 7 illustrates a simplified view of a first type of branching in accordance with a preferred embodiment of the present invention. Each major branch 708 consists of a few branches having the same (or close to be the same) projections on the wafer surface. At the branching point 714, the branches split off each other, thus forming the plurality of minor branches 710. The cooling channels 712 can go through the antenna branches to ensure acceptable temperature regime for the antenna.

The present invention allows several types of antenna branching to be considered. The preferred type of branching corresponds to the case (FIG. 7) when the projection of the antenna's field on the plane of the wafer looks like a major branch is branching (i.e. when the minor branches split off the major branches). Actually, each major branch consists of a few branches (see, FIG. 7); it is just their projection on the wafer plane looks like it is almost a single major branch. This provides more uniform electromagnetic (EM) field above the wafer and, respectively, more uniform plasma generation throughout the whole area of the wafer both near the wafer center and closer to its periphery.

An alternate type of branching is coplanar branching, where the major and minor branches of the antenna lie substantially in the same plane.

In addition, modifications to the branching principle are allowed. For example, when the projections on the wafer plane are not exactly combined into single major branches, but still there is significant grouping of branches (see, FIG. 6, as compared with FIG. 5), are covered under the present invention as well.

Figure 8:
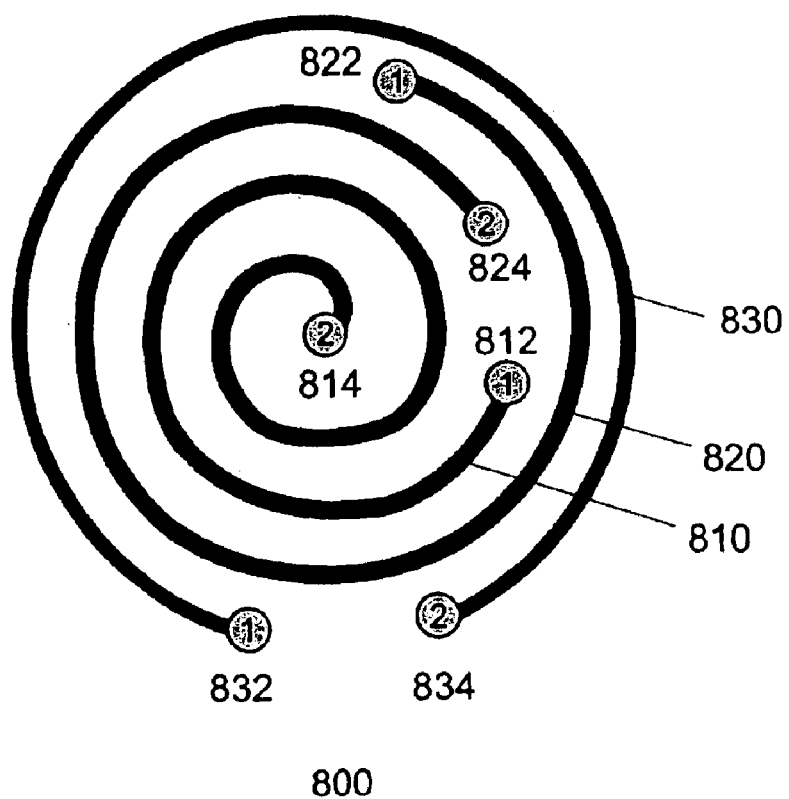
FIG. 8 illustrates a simplified view of a fifth type of branching RF antenna in accordance with an alternate embodiment of the present invention.

Another type of branching is illustrated in FIG. 8. In this case, the full length of antenna (such, for example, as the flat spiral antenna) is divided into a few branches, so the electrical length of each branch is short enough to avoid standing wave effects). The principle of equal (or close to equal) electric load of each branch is beneficial in most usual situations and is chosen as a preferred embodiment, as the antenna tuning and uniform plasma generation would be most easily supported.

Still, there might be cases when one would prefer a non-uniform plasma generation (e.g., higher plasma generation rate at the wafer periphery). In that case, the principle of equal load for the branches might not be applicable.

FIG. 8 illustrates a simplified view of a fifth type of branching RF antenna and second type of branching significantly different from those presented in FIGS. 2–6, in accordance with embodiments of the present invention. Branching RF antenna 800 comprises a plurality of branches 810, 820 and 830 each branch is a part of a planar spiral. Each branch 810, 820 and 830 has a different radial area Branches 810, 820 and 830 are fed at the first ends, i.e. 812, 822 and 832, respectively, while the other ends, 814, 824 and 834 are electrically grounded. In addition, a single RF power generator can power all branches or different RF power generators (with the same or different RF frequencies, phases or amplitudes) can power different branches. The powered and grounded ends of each branch can be switched, which would exchange powered and grounded ends.

In the illustrated embodiment, outer branch 830 comprises a single turn; middle branch 820 comprises about one and a half turns; and inner branch 810 comprises about two turns. A turn is a single revolution of the negative or positive direction. Alternatively, branches 810, 820, and 830 can have different numbers of turns. Outer branch 830 has a first end 832 and second end 834. Middle branch 820 has a first end 822 and second end 824. Inner branch 810 has first end 812 and second end 814. To obtain equal loads, a preferred configuration for antenna 800 should have a different number of turns for each branch with inner branch 810 having the highest number of turns.

Furthermore, in cases when the load for the branches differ due to the radial dependence of certain processes as well as the rate of plasma and gas diffusion, different matching networks and/or RF sources can drive the different branches. The specific tuning of the antenna branch parameters are needed to compensate for the radial dependence of processes thus providing a radially independent plasma density profile. When the generation of radially non-uniform plasma is required in special circumstances, the embodiment shown in FIG. 8 can be conveniently applied.

The surface of branching RF antenna 800 shown in FIG. 8 can be flat, but such an antenna can also be adjusted to the dome-shape or other non-flat surface.

The present invention can be effectively applied to plasma processing apparatus such as an etching apparatus. The present invention can also be applied to a plasma processing apparatus other than an etching apparatus, e.g., a film-forming apparatus or an ashing apparatus. The present invention can also be applied to a plasma processing apparatus for a target object other than a semiconductor wafer, e.g., an LCD glass substrate. Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing system for subjecting a target object to a plasma process, said system comprising:
   process chamber;
   gas supply system for supplying a process gas to said process chamber;
   exhaust system for exhausting and controlling pressure in said process chamber;
   susceptor arranged in said process chamber, said susceptor having a work surface for supporting said target object in said process chamber; and
   inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, and wherein said ICP source further comprises a Faraday shield located between said branching RF antenna and said plasma.

2. The plasma processing system as claimed in claim 1, wherein said ICP source further comprises a matching network coupled to said RF source and said branching RF antenna.

3. The plasma processing system as claimed in claim 1, wherein said plurality of major branches are coplanar.

4. The plasma processing system as claimed in claim 1, wherein said plurality of minor branches are coplanar.

5. The plasma processing system as claimed in claim 1, wherein said plurality of major branches and said plurality of minor branches are coplanar.

6. The plasma processing system as claimed in claim 1, wherein said branching RF antenna further comprises a central feed element coupled to said RF source and said at least one major branch is coupled to said central feed element and at least one minor branch is coupled to ground.

7. The plasma processing system as claimed in claim 1, wherein said branching RF antenna further comprises a central feed element coupled to ground and said at least one major branches is coupled to said central feed element and at least one minor branch is coupled to said RF source.

8. The plasma processing system as claimed in claim 1, wherein a major branch comprises a number of branches electromagnetically coupled to each other.

9. The plasma processing system as claimed in claim 1, wherein a major branch comprises a number of branches electrically coupled to each other.

10. The plasma processing system as claimed in claim 1, wherein a major branch comprises a number of branches mechanically coupled to each other.

11. The plasma processing system as claimed in claim 1, wherein said RF branching antenna further comprises a central feed element adapted for independently providing RF power to at least two major branches.

12. The plasma processing system as claimed in claim 1, wherein a number of major branches and a number of minor branches comprise cooling channels.

13. The plasma processing system as claimed in claim 1, further comprising a dielectric window is located between said branching RF antenna and said plasma.

14. The plasma processing system as claimed in claim 1, wherein the branching RF antenna is formed on at least one substantially flat surface.

15. The plasma processing system as claimed in claim 1, wherein the branching RF antenna is formed on at least one substantially curved surface.

16. The plasma processing system as claimed in claim 1, further comprising a second RF source coupled to said susceptor.

17. The plasma processing system as claimed in claim 1, further comprising a controller coupled to said ICP source.

18. A plasma processing system for subjecting a target object to a plasma process, said system comprising:
process chamber;
gas supply system for supplying a process gas to said process chamber;
exhaust system for exhausting and controlling pressure in said process chamber;
susceptor arranged in said process chamber, said susceptor having a work surface for supporting said target object in said process chamber; and
inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, and wherein a first end of a minor branch is coupled to a major branch and a second end of said minor branch is coupled to another minor branch.

19. The plasma processing system as claimed in claim 18, wherein the branching of type two occurs, when the full length of antenna is divided into a few branches, so the electrical length of each branch is short enough to avoid standing wave effects.

20. A plasma processing system for subjecting a target object to a plasma process, said system comprising:
process chamber;
gas supply system for supplying a process gas to said process chamber;
exhaust system for exhausting and controlling pressure in said process chamber;
susceptor arranged in said process chamber, said susceptor having a work surface for supporting said target object in said process chamber; and
inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein at least one major branch comprises branching points and at least two minor branches are coupled at each branching point, and wherein at least one major branch is substantially curved and at least one minor branch is substantially straight.

21. A plasma processing system for subjecting a target object to a plasma process, said system comprising:
process chamber;
gas supply system for supplying a process gas to said process chamber;
exhaust system for exhausting and controlling pressure in said process chamber;
susceptor arranged in said process chamber, said susceptor having a work surface for supporting said target object in said process chamber; and
inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein at least one major branch comprises branching points and at least two minor branches are coupled at each branching point, and wherein at least one major branch is substantially straight and at least one minor branch is substantially curved.

22. A plasma processing system for subjecting a target object to a plasma process, said system comprising:
process chamber;
gas supply system for supplying a process gas to said process chamber;
exhaust system for exhausting and controlling pressure in said process chamber;
susceptor arranged in said process chamber, said susceptor having a work surface for supporting said target object in said process chamber; and
inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein at least one of said plurality of major branches and said plurality of major branches are non-coplanar.

23. A plasma processing system, for subjecting a target object to a plasma process, said system comprising:
 process chamber;
 gas supply system for supplying a process gas to said process chamber;
 exhaust system for exhausting and controlling pressure in said process chamber;
 susceptor arranged in said process chamber, said susceptor having a work surface for supporting said target object in said process chamber; and
 inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein at least one major branch comprises branching points and at least two minor branches are coupled at each branching point, and wherein said branching RF antenna further comprises a central feed element coupled to said RF source and said at least one major branch is coupled to said central feed element and at least one minor branch is coupled to ground through a capacitor.

24. A plasma processing system for subjecting a target object to a plasma process, said system comprising:
 process chamber;
 gas supply system for supplying a process gas to said process chamber;
 exhaust system for exhausting and controlling pressure in said process chamber;
 susceptor arranged in said process chamber, said susceptor having a work surface for supporting said target object in said process chamber; and
 inductively coupled plasma (ICP) source, said ICP source comprising an RF source and a branching RE antenna for establishing a plasma in said process chamber during said plasma process, wherein said branching RF antenna comprises a plurality of major branches and a plurality of minor branches coupled to said plurality of major branches, wherein said plasma processing system further comprises a second RF source, wherein a first major branch is coupled to said RF source and a second major branch is coupled to said second RF source, said first major branch comprising a first branching point, said second major branch comprising a second branching point, wherein at least two minor branches are coupled at said first branching point and at least two minor branches are coupled at said second branching point.

25. A plasma processing system for subjecting a target object to a plasma process said system comprising:
 process chamber;
 gas supply system for supplying a process gas to said process chamber;
 exhaust system for exhausting and controlling pressure in said process chamber;
 susceptor arranged in said process chamber, said susceptor having a work surface for supporting said target object in said process chamber; and
 inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein said RF branching antenna comprises a plurality of elements, each element comprising a major branch and at least two minor branches coupled to said major branch, said plurality of elements providing substantially equal electric loads.

26. A plasma processing system for subjecting a target object to a plasma process, said system comprising:
 process chamber;
 gas supply system for supplying a process gas to said process chamber;
 exhaust system for exhausting and controlling pressure in said process chamber;
 susceptor arranged in said process chamber, said susceptor having a work surface for supporting said target object in said process chamber; and
 inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein said RF branching antenna comprises a plurality of elements, each element comprising a major branch and at least two minor branches coupled to said major branch, said plurality of elements providing substantially different electric loads.

27. A plasma processing system for subjecting a target object to a plasma process, said system comprising:
 process chamber;
 gas supply system for supplying a process gas to said process chamber;
 exhaust system for exhausting and controlling pressure in said process chamber;
 susceptor arranged in said process chamber, said susceptor having a work surface for supporting said target object in said process chamber; and
 inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein said branching antenna comprises at least one of: a major branch having a first end coupled to said RF source and a second end coupled to ground, and a minor branch having a first end coupled to a major branch and a second end coupled to ground.

28. A plasma processing system for subjecting a target object to a plasma process, said system comprising:
 process chamber;
 gas supply system for supplying a process gas to said process chamber;
 exhaust system for exhausting and controlling pressure in said process chamber;
 susceptor arranged in said process chamber, said susceptor having a work surface for supporting said target object in said process chamber; and
 inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches coupled to said plurality of major branches, wherein at least one major branch comprises branching points and at least two minor branches are coupled at each branching point, and wherein the coupling angle between a major branch and a minor branch is equal to or greater than ninety degrees.

29. A plasma processing system for subjecting a target object to a plasma process, said system comprising:

process chamber for containing a plasma;

exhaust system for exhausting and controlling pressure in said process chamber;

susceptor arranged in said process chamber, said susceptor having a work surface for supporting said target object in said process chamber;

branching RF antenna for generating an RF field for exciting and ionizing said process gas in said process chamber to convert said process gas into said plasma, wherein said branching RF antenna comprises a plurality of major branches and a plurality of minor branches arranged around a central feed element;

RF power supply coupled to said central feed element, said RF power supply for supplying an RF power to said branching RF antenna;

a dielectric window located between branching RF antenna and the plasma;

a Faraday shield located between branching RF antenna and the plasma; and a gas supply system coupled to said Faraday shield, wherein said gas supply system supplies a process gas to process chamber.

30. A plasma processing system for subjecting a target object to a plasma process, said system comprising:

process chamber;

gas supply system for supplying a process gas to said process chamber;

exhaust system for exhausting and controlling pressure in said process chamber;

susceptor arranged in said process chamber, said susceptor having a work surface for supporting said target object in said process chamber; and inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches arranged in a first pattern, wherein said first pattern comprises at least one major branch radially extending from a central feed element to a branch point and at least two minor branches extending from said branch point, and wherein a major branch radially extends from said central feed element to said branch point in a substantially straight direction and a minor branch extends from said branch point to an end point in a substantially curved direction.

31. A plasma processing system for subjecting a target object to a plasma process, said system comprising:

process chamber;

gas supply system for supplying a process gas to said process chamber;

exhaust system for exhausting and controlling pressure in said process chamber;

susceptor arranged in said process chamber, said susceptor having a work surface for supporting said target object in said process chamber; and inductively coupled plasma (ICP) source, said ICP source comprising an RF source and a branching RF antenna for establishing a plasma in said process chamber during said plasma process, wherein said branching RF antenna comprises a plurality of major branches and a plurality of minor branches arranged in a first pattern, wherein said first pattern comprises at least one major branch radially extending from a central feed element to a branch point and at least two minor branches extending from said branch point, and wherein a major branch extends from said central feed element to said branch point in a substantially cured direction and a minor branch extends from said branch point to an end point in a substantially straight direction.

* * * * *